United States Patent [19]

Bartelink et al.

[11] 3,737,741

[45] June 5, 1973

[54] SEMICONDUCTOR DEVICES UTILIZING GEOMETRICALLY CONTROLLABLE CURRENT FILAMENTS

[75] Inventors: Dirk Jan Bartelink, Morris Township, Morris County; George Persky, North Plainfield, both of N.J.

[73] Assignee: Bell Telephone Laboratories, Incorporated, Murray Hill, N.J.

[22] Filed: Nov. 22, 1971

[21] Appl. No.: 201,093

[52] U.S. Cl...317/235 R, 317/235 AB, 317/235 AA, 317/235 N, 317/235 AD, 307/305, 317/235 H

[51] Int. Cl. .......... H01l 11/10

[58] Field of Search .......... 317/235 AB, 235 AA, 317/235 N, 235 AD, 235 H; 307/305, 299

[56] References Cited

UNITED STATES PATENTS

| | | | |
|---|---|---|---|
| 3,465,216 | 9/1969 | Teszner | 317/235 |
| 3,668,439 | 6/1972 | Fujikawa | 307/309 |

*Primary Examiner*—Martin H. Edlow
*Attorney*—R. J. Guenther, Arthur J. Torsiglieri et al.

[57] ABSTRACT

A PNIPN (or PNPN) semiconductor structure, with a pair of terminals on each of the intermediate N and P zones, is forward biased with respect to the outer P and N zones. Thereby, a current filament is formed whose lateral position can be controlled by control of the voltages across each of the pairs of terminals, as well as by an external magnetic field. Such current filaments can be utilized in a variety of semiconductor devices including magnetic field detectors, optical cameras, binary encoders and other logic devices.

10 Claims, 6 Drawing Figures

SEMICONDUCTOR DEVICES UTILIZING GEOMETRICALLY CONTROLLABLE CURRENT FILAMENTS

FIELD OF THE INVENTION

This invention relates to the field of solid state semiconductor apparatus, and more particularly to semiconductive devices in which electrical current filaments are geometrically controlled by applied electric and/or magnetic fields.

BACKGROUND OF THE INVENTION

PNPN semiconductor transistor devices are known to be subject to the phenomenon of "breakdown"; that is, in the current-controlled mode of operation, the profile of the cross section of the current flowing in the device is characterized by a sharp concentration (or maximum) at a single location when the total current exceeds a threshold value. This location, at which the current breakdown is said to "nucleate," occurs at random; that is, at a location dependent upon chance disturbances in the semiconductor, such as temperature distribution or impurity doping profile. In addition, when the total current exceeds the threshold, the voltage across the device suddenly drops ("switches") to a much lower value than just before threshold; thereby, an almost "infinite" negative resistance or impedance is presented by the device, for all practical purposes.

It would be desirable to be able to control and monitor the location of the occurrence of current concentration in a solid state device, particularly in a current-controlled semiconductor device; and thereby to have the location of the concentrated current serve as an indicator or detector of such control, such as in a semiconductor detector of a magnetic field.

SUMMARY OF THE INVENTION

A geometrically controllable current filament, in a forward biased PNIPN (or more simply PNPN) semiconductor structure, is obtained by means of voltage control between at least two spaced apart terminals attached advantageously to each of the intermediate P and N zones, utilizing the transverse ("lateral") electrical resistivity ("spreading resistance") of these intermediate zones. It should be understood that the symbol I represents a zone of high resistivity semiconductor, that is, one having a resistivity at least an order of magnitude greater than that of either of the intermediate N and P zones between which this I zone is sandwiched. The intermediate I zone (as defined by net significant impurity concentration in the semiconductor material) can be omitted, that is to say, the width of this I zone can be narrowed to zero; and the depletion region between the reverse biased intermediate N and P zones of the resulting more simple PNPN semiconductor structure can then be used for the same purposes and functions as the I zone in this invention, provided any reverse voltage bias applied across the intermediate P and N zones is restricted to sufficiently low values in order to prevent any avalanche breakdown.

By a "current filament" in this invention is meant an electrical current in the (high resistivity) I zone, the distribution of the current density being characterized by a sharp maximum, resulting in typically over 90 percent of the total current flowing in the I zone being concentrated within a cross-section area which is no more than one tenth the cross-section area of the I-type zone itself. The intermediate N and P zones are reverse biased and are fabricated with a moderate electrical resistivity. (Too low a transverse ("spreading") resistivity in these intermediate zones will result in poor resolution, i.e., a relatively wide cross-section area of the current filament; on the other hand, too high a transverse resistivity in these intermediate zones will result in distortion of filament path due to a resulting lack of distinction between the I zone and the intermediate zones.) In addition, the thickness of the intermediate zones is advantageously made less than the diffusion length of the respective minority carriers therein; so that, for example, electron charge carriers injected by the (forward biased) N-type outer zone will readily pass through the immediately adjacent P-type intermediate zone, and propagate through the I zone to the other N-type intermediate zone. Similarly, the hole charge carriers injected by the outer P zone pass through the immediately adjacent intermediate N zone, and through the I zone to the intermediate P zone.

The I zone is advantageously fabricated of sufficient thickness to prevent avalanche breakdown anywhere therein. (For impurity profiles, however, which are suitable and which prevent avalanche breakdown during operation, the I zone can be omitted and the simpler PNPN semiconductor structure used in this invention.) Moreover, the reverse bias applied across the intermediate N and P zones is advantageously sufficient to deplete this I zone at all locations therein between these intermediate zones.

Stability of the current filament described above is achieved by means of control over a reverse bias voltage applied between the terminals of the intermediate N zone and the terminals of the intermediate P zone. By "stability" is meant that as the current supplied to the outer forward biased current-controlled P and N zones is slowly increased to a value above the threshold for filament formation, the instantaneous voltage across these outer zones slowly decreases rather than oscillating or abruptly decreasing (as in "switching"). Typically, practical and stable negative resistances of $10^5$ ohms in magnitude or less can be achieved in this invention, rather than the ordinary breakdown negative resistance of $10^6$ ohms or more in magnitude as is characteristic of devices in the prior art. It should be understood, however, that *stable* negative resistances of more than $10^5$ ohms in magnitude may also be usefully achieved in the practice of this invention.

The transverse location of the current filaments in the PNIPN structures of this invention, in some applications thereof, can be controlled by external magnetic fields. In other applications of this invention, the location of the current filament is controlled by the instantaneous applied voltage across the spaced apart terminals on at least one of the intermediate P or N zones. Alternatively, the location of the current filament can be shifted by varying the voltage applied between one of the terminals on one of the intermediate zones relative to the other of the intermediate zones. Thus, these current filaments can be utilized in a variety of applications, such as magnetic detectors, encoders, logic devices, as well as optical cameras.

In a specific embodiment of this invention, a body of high resistivity monocrystalline silicon semiconductor contains therein a pair of separated P-type and N-type surface zones of moderate electrical conductivity. Another surface zone of P-type conductivity is located within the surface zone of moderate N-type conductivity, and a surface zone of N-type conductivity is located within the surface zone of moderate P-type conductivity. All of these surface zones are located contiguous with a single major planar surface of the silicon body, to form a PNIPN conductivity semiconductor structure in a planar configuration. The intermediate N- and P-type zones are each provided with a pair of spaced apart terminals, the terminals in each of the pairs being electrically connected together to a separate common terminal. These common terminals are in turn electrically connected together through an ohmic resistor across which a reverse voltage bias is applied. An electrical current source, connected across the outer P and N zones, supplies forward bias to these outer P and N zones. As a result, a current filament is formed in the high resistivity I zone between the intermediate N and P zones. The location of this current filament can be transversely displaced by means of an external magnetic field. Advantageously, the thickness of the I zone is such as to provide sufficient space in which the magnetic field acts on the current filament therein. The amount of the transverse (lateral) displacement of the current filament caused by the magnetic field can be detected by measurement of the changes in the resulting electrical current flowing through each of the terminals of the intermediate N (or P) zone.

The sensitivity of measurement of magnetic fields in this invention can be significantly greater than in the conventional Hall effect.

BRIEF DESCRIPTION OF DRAWING

This invention, together with its features, objects, and advantages may be better understood from the following detailed description when read in conjunction with the drawing (not to scale for the sake of clarity) in which.

DETAILED DESCRIPTION

Figure 1:
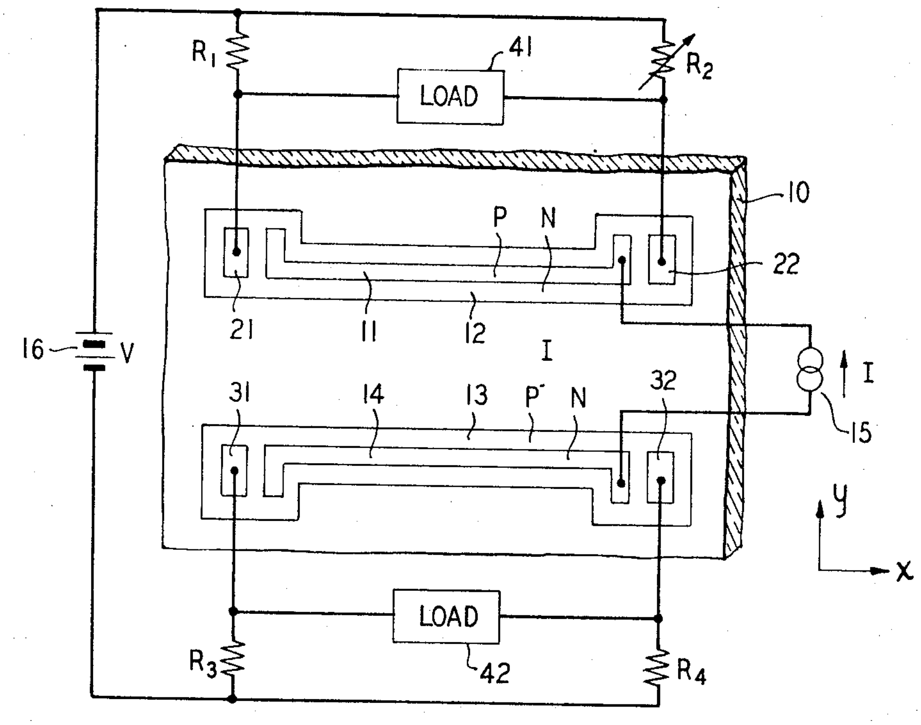
FIG. 1 is a top view perspective diagram (partly in cross section) of semiconductor current filament apparatus with two external electrical sources, in accordance with a specific embodiment of the invention.

FIG. 1 shows a top view of the surface of a current filament device built into a high resistivity (I type) semiconductor body 10, typically monocrystalline semiconductor silicon having a resistivity of the order of 100 ohm cm. The body 10 is provided with a surface zone 12 of moderate N-type conductivity, typically having been formed by diffusion of donor impurities into the top surface of the body 10. Within this zone 12 is located a surface zone 11 of P-type conductivity, typically formed by diffusion of acceptor impurities into a portion of zone 12. Zone 12 is provided with a pair of $N^+$ (high conductivity) zones 21 and 22 adapted for providing external electrical contact to zone 12. Advantageously, the intersections of both zones 11 and 12 with the top surface of the body 10 are elongated in shape, for example, in the $x$ direction as indicated at the right-hand side of FIG. 1.

Zones 13 and 14, of P-type and N-type conductivity, respectively, are mirror images of zones 12 and 11, respectively, both with respect to homologous geometrical contour and homologous and conductivity type. Likewise, high conductivity $P^+$ zones 31 and 32 are mirror images of zones 21 and 22, respectively. In these mirror images, however, it is not necessary that the geometry or resistivity be precisely preserved.

As further indicated in the FIG. 1, one terminal of each of the resistors $R_1$ and $R_2$ is connected respectively to $N^+$ zones 21 and 22; and a load 41 is connected across these zones 21 and 22. Likewise, resistors $R_3$ and $R_4$ are connected to $P^+$ zones 31 and 32; and load 42 is connected across these zones 31 and 32. In addition, resistors $R_1$ and $R_2$ are connected to the positive side of an external battery source 16 of a voltage V; and resistors $R_3$ and $R_4$ are connected to the negative terminal of this voltage source 16. Advantageously, the resistors $R_1$–$R_4$ all have the same electrical resistance. A current source 15 is connected to the right-hand extremities of zones 11 and 14 to provide forward current to these zones sufficient to cause a current filament to flow in the I region of the body 10 between zones 12 and 13. The presence of such a current filament is indicated by a negative incremental resistance across the terminals to zones 11 and 14, as discussed previously.

In the presence of an external magnetic field in the direction perpendicular to the plane of the drawing in FIG. 1, the current filament can be shifted laterally in the $x$ direction; and this lateral shift can be detected by a change of voltage either across load 41 or across load 42. For an appropriate value of V, supplied by the battery 16, this current filament will be located running between a point midway between the left-hand and right-hand extremity of zone 12, and a point midway between the left-hand and right-hand extremity of zone 13. Variation of any of the resistors $R_1$ through $R_4$, say $R_2$ (FIG. 1) can shift the location of this current filament in the $x$ direction, by reason of the consequent variation of the reverse bias voltage across the corresponding terminals of the intermediate P and N zones. Variations in a magnetic field (perpendicular to the plane of the drawing in FIG. 1) can also shift the location of this current filament in the $x$ direction.

For purposes of illustration only, in a typical example, the body 10 (except for the zones 11–14) is uniformly 100 ohms cm resistivity silicon, having a thickness of 100 microns in the $z$ direction (perpendicular to the plane of FIG. 1). Zone 11 is approximately 400 microns long in the $x$ direction, 5 microns wide in the $y$ direction, and 0.3 microns deep in the $z$ direction; whereas the sheet resistance of zone 11 is of the order of 200 ohm per square. Zone 12 is approximately 500 microns long in the $x$ direction, 15 microns wide in the $y$ direction, and 0.6 microns deep in the $z$ direction; whereas the sheet resistance of zone 12 is of the order of 3,000 ohm per square. Zone 13 is approximately 500 microns long in the $x$ direction, 15 microns wide in the $y$ direction, and 0.6 microns deep in the $z$ direction; whereas the sheet resistance of zone 13 is of the order of 3,000 ohm per square. Moreover, zone 13 is typically spaced about 50 to 100 microns from zone 12 in the $y$ direction. Zone 14 is approximately 400 microns long in the $x$ direction, 5 microns wide in the $y$ direction, and 0.3 microns deep in the $z$ direction; whereas the sheet resistance of zone 14 is of the order of 100 ohm per square. Resistors $R_1$ through $R_4$ are each of the order of 50,000 ohms; while the voltage V supplied by the battery 16 is approximately 20 volts. Finally, the current source 15 provides 0.1 milliamps after the current filament has formed.

Figure 2:
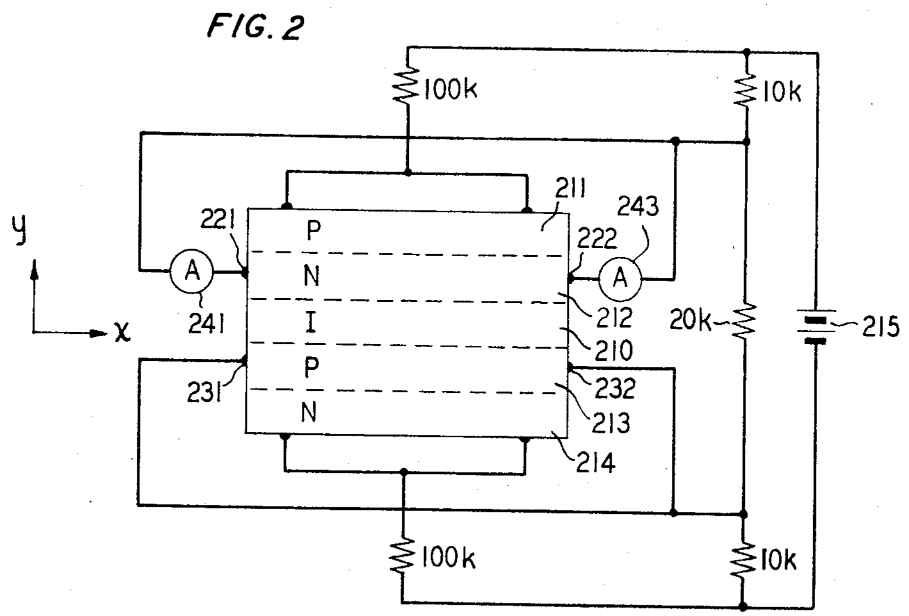
FIG. 2 is a schematic diagram of semiconductor current filament apparatus with a single external electrical source, in accordance with another specific embodiment of this invention.

FIG. 2 shows a schematic diagram of a semiconductor filament device in accordance with another specific embodiment of the invention. It should be understood that although this device is shown schematically, it may be fabricated in a planar geometry similar to the device shown in FIG. 1. The device shown in FIG. 2 is similar in many respects to the device shown in FIG. 1 and therefore corresponding elements in FIG. 2 have been labeled with reference numerals which are equal to the reference numerals used in FIG. 1 plus two hundred. A semiconductor body having a high resistivity I zone 210 (FIG. 2) also contains surface P zones 211 and 213, and surface N zones 212 and 214, forming a PNIPN conductivity type structure. Resistors of 100 K ohm are connected each to two spaced apart terminals on the P zone 211, and on the N zone 214, respectively. These 100 K ohm resistors, in combination with a battery 215, provide a current source for the PNIPN structure. Typically, the battery 215 supplies approximately 30 volts. A pair of 10 K ohm resistors, in combination with 20 K ohm resistor (FIG. 2), connected across the terminals of battery 215 in a voltage divider arrangement, provide a reverse voltage bias across zones 212 and 213. It is important that the two terminals of 20 K ohm resistor each be connected with at least two spaced apart terminals 221 and 222 (on zone 212), and with at least two spaced apart terminals 231 and 232 (on zone 213). Current detectors 241 and 243, which are connected to the terminals 221 and 222 respectively, will sense the position of the resulting current filament flowing between zones 212 and 213 through a portion of the high resistivity body 210. Specifically, as the current filament moves from the left to the right in FIG. 2 (in the positive $x$ direction), under the influence of a magnetic field perpendicular to the plane of the drawing, the current in detector 241 will decrease while the current in detector 243 will increase.

The terminals 221 and 222 are maintained at the same electrical potential by wire leads electrically connecting them together, thereby maintaining at the same electrical potential the immediately adjacent portions of the intermediate N zone 212. Similarly, the terminals 231 and 232 are maintained at zero electrical potential difference.

In the absence of an external magnetic field, the current filament in the body 210 tends to form around a central axis intersecting the intermediate P zone 213 at a point equidistant between the terminals 231 and 232, and intersecting the intermediate N zone 212 at a point midway (equidistant) between the terminals 221 and 222, assuming uniform resistivity and thickness in these intermediate zones 212 and 213.

In operation of the device shown in FIG. 2, (hole) charge carriers ("holes") are injected from the outer P zone 211, through the intermediate N zone 212, through the I zone 210 to the intermediate P zone 213 where some of these charge carriers are collected by terminal 231 and others of these carriers are collected by terminal 232. In the P zone 213, due to the transverse flow (in $x$ direction) of charge carriers to the terminals 231 and 232, the electrical potential profile develops a maximum at a point in P zone 213 located midway between these terminals, assuming that this P zone 213 is characterized by uniform transverse resistivity. Thereby, a strong tendency develops for electrons injected by the outer N zone 214 to concentrate at this midway point between terminals 231 and 232 prior to propagation through the I zone 210. Likewise, when these electrons arrived at the intermediate N zone 212, some of these electrons are collected by terminals 221 and others by terminal 222. Again, due to this transverse flow of electrons in this N zone 212, the electrical potential develops a minimum at a point in the N zone 212 located midway between terminals 221 and 222. Thereby, a strong tendency develops for holes injected by the outer zone 211 to concentrate at this midway point between the terminals 221 and 222 prior to propagation through the I zone 210. Thus, the transverse flow of charge carriers in both the intermediate P zone 213 and the intermediate N zone 212 to the corresponding pairs of terminals (231, 232 and 221, 222) tends to concentrate a current filament in the I zone 210 with its central axis intersecting these intermediate zones midway between the corresponding terminal pairs.

For purposes of illustration in a typical example, with the zones 211, 212, 213, 214 having the same resistivity and actual geometrical structure as indicated above for the device shown in FIG. 1, the current in the detectors 241 and 243 is approximately 40 microamperes. A magnetic field of approximately a kilogauss, directed in the $z$ direction, will cause a change in the current in each of the detectors 241 and 243 by approximately 8 or 9 percent. This change in current is almost 20 times as much as would be expected (0.5 percent) by reason of the conventional Hall effect, and is caused by a transverse displacement by the magnetic field of the current filament propagating in the I zone 210.

Figure 3:
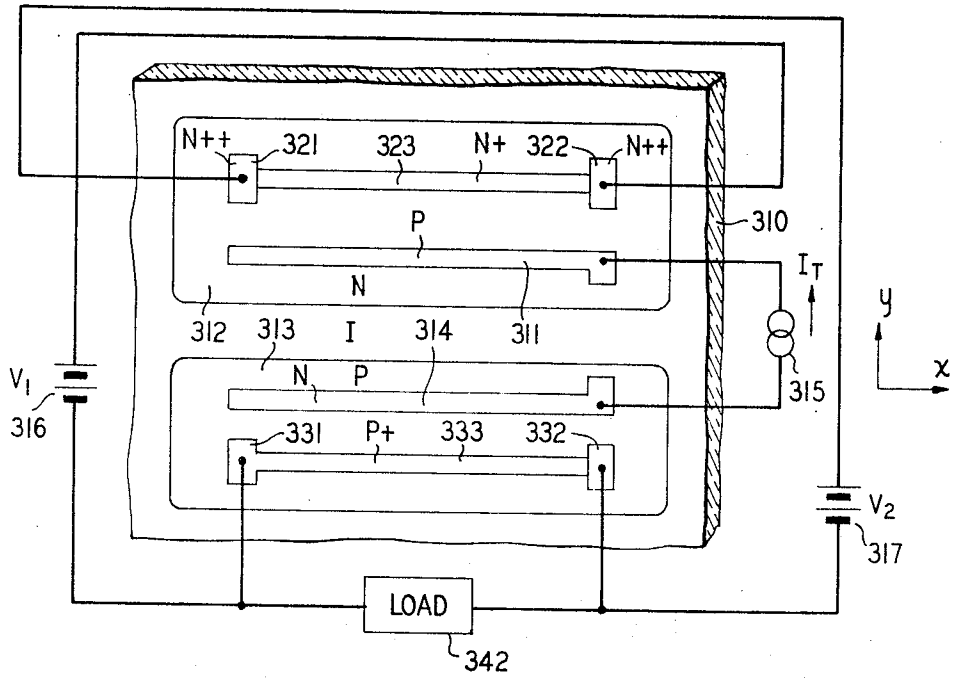
FIG. 3 is a top view perspective diagram (partly in cross section) of a semiconductor current filament apparatus with three external electrical sources, in accordance with still another specific embodiment of this invention.

FIG. 3 shows a top view diagram of a semiconductor current filament device in accordance with yet another specific embodiment of the invention. Many of the elements in the apparatus shown in FIG. 3 are similar to those shown in FIG. 1; accordingly, for such similar elements, the reference numerals used in FIG. 3 are equal to the corresponding reference numerals used in FIG. 1 plus 300. It is expected that the device shown in FIG. 3 will yield a current filament in the body 310 with a cross section appreciably sharper than the cross section of the current filament formed in the device shown in FIG. 1.

As shown in FIG. 3, body 310 of monocrystalline high resistivity (I) semiconductor is provided with a surface N zone 312 and a surface P zone 313. The surface N zone 312 contains a surface $P^+$ zone 311 and a surface $N^+$ zone 323; the surface P zone 313 contains a surface N zone 314 and surface $P^+$ zone 333. A pair of terminal contact $N^{++}$ zones (very high conductivity, that is higher than $N^+$) 321 and 322 is provided at the extremities of $N^+$ zone 323; whereas pair of terminal $P^{++}$ zones 331 and 332 is provided at the extremities of the $P^+$ zone 333. These terminal zones (321, 322 and 331, 332) are adapted for external electrical connection to the $N^+$ zone 323 and to the $P^+$ zone 333 respectively. The resistance between $N^{++}$ terminal zones 321 and 322 through the $N^+$ zone 323 should be at least sufficient to overcome thermal noise fluctuations (several kT/e). On the other hand, this resistance (r323) of $N^+$ zone 323 should be appreciably less than the resistance (*r*312) through the N zone 312 between any point on P zone 311 and this $N^+$ zone 323. Thereby, the functions of both control over the width of the current filament and of control over the location of the filament are independently determined by the values of these resistances *r*323 and *r*312.

Batteries 316 and 317, of substantially equal voltages $V_1$ and $V_2$, supply reverse bias voltage across zones 312 and 313. A current source 315 provides forward current to zones 311 and 314 sufficient to cause a current filament to form between the P zone 311 and the N zone 314. It should be noted that the electrical connections to terminal zones 321, 322, 331 and 332 are cross-connected as shown in FIG. 3, rather than pairwise connected as correspondingly shown in FIG. 1. A load 342 (typically a resistor) across the terminal 331 and 332 detects the voltage between these terminals. Changes in this voltage reflect changes in the location in the *x* direction of the current filament flowing in the body 310 between zones 311 and 314. An external magnetic field, directed perpendicular to the plane of the drawing of FIG. 3, will displace the current filament in the *x* direction and thereby change the voltage across the load 342. Moreover, this load 342 also provides a restoring force tending to return the current filament to an equilibrium location (in the *x* direction) between the extremities of zones 311 and 314.

Figure 4:
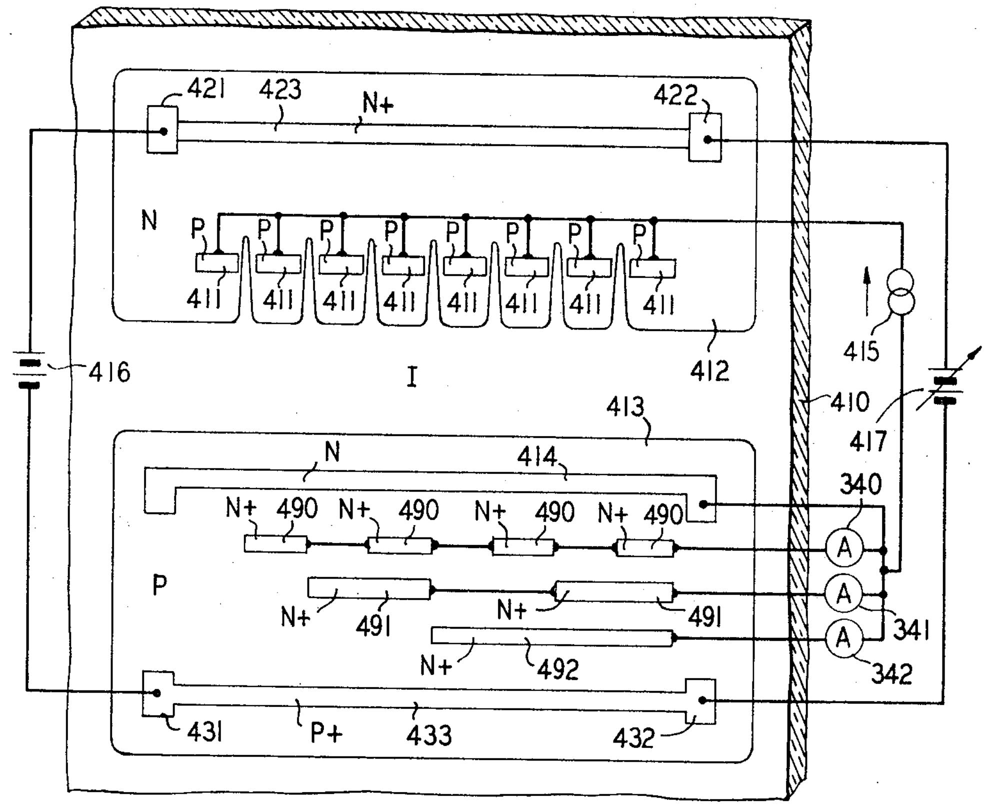
FIG. 4 is a top view diagram of a semiconductor current filament apparatus, for use as a binary encoder, according to yet another embodiment of this invention.

FIG. 4 is a top view of a semiconductor filament device adapted for use as a binary encoder according to still another embodiment of the invention. Again, there are many elements in the apparatus shown in FIG. 4 which are similar to, and have similar functions as, the apparatus shown in FIG. 1. Accordingly, for such similar elements, reference numerals in FIG. 4 are used which are equal to the reference numerals used in FIG. 1 plus 400.

As shown in FIG. 4, a body 410 of high resistivity (I) semiconductor contains an N-type surface zone 412, and a separate P-type surface zone 413. Both surface zones 412 and 413 are located on the top surface of the body 410. Either substantially identical P surface zones 411 are located within the N zone 412. The outer contour of the N zone 412 is scalloped shaped (FIG. 4), so that all next neighbor P zones 411 are thereby mutually separated at their closest proximity by a surface portion of the high resistivity semiconductor of the body 410. In addition, the N zone 412 is provided with an elongated $N^+$ surface zone 423 together with terminal $N^{++}$ zones 421 and 422 adapted for external electrical connections to this $N^+$ zone 423.

The P zone 413 is provided with an elongated N surface zone 414 and an elongated $P^+$ surface zone 433. Between these zones 414 and 433 is located an array of four $N^+$ zones 490, two $N^+$ zones 491 and one $N^+$ zone 492 (see FIG. 4), all in a binary encoding configuration, as known in the art. All of the four $N^+$ zones 490 are ohmically connected together in common to a current detector 340. Likewise, the two $N^+$ zones 491 are connected together with ohmic connections to another current detector 341. Finally, $N^+$ zone 492 is ohmically connected to yet another current detector 342. The geometrical arrangement of the various $N^+$ zones 490 from left to right is such that a current filament formed between, for example, the next to extreme left-hand P zone 411 and the $N^+$ zone 414 is annexed to this latter zone 414 at a location closest to the extreme left-hand $N^+$ zone 490. That is, there is a corresponding registry of the $N^+$ zones 490, 491 and 492 with respect to the various P zones 411 in order to accomplish the desired encoding, as explained more fully below.

A current source 415 is connected to one extremity of the N zone 414 as well as to the detectors 340–342 and to the P zones 411, all of which are likewise connected together in common with ohmic electrical connectors. Substantially equal voltage batteries 416 and 417 are connected to the terminal zones 431 and 432 for electrical connection to $P^+$ zone 433, as well as to terminal zones 421 and 422 for electrical connection to $N^+$ zone 423.

In operation of the apparatus shown in FIG. 4, the voltage supplied by the battery 417 is varied, thereby varying the location in the *x* direction of the current filament which flows between one of the P zones 411 and the $N^+$ zone 414 when sufficient current is supplied by the current source 415. In view of the discreteness of the zones 411, the filament of current at any moment of time tends to be confined to flow between only one of the zones 411 and the $N^+$ zone 414. On the other hand, depending upon at which of the eight zones 411 the current filament is flowing at any instant of time, the detectors 340–342 will show different combinations of current. In particular, if the current filament is located at the element third from the extreme left-hand P zone 411, then only the detector 341 will yield a larger current than the other detectors 340 and 342. In case the current filament is located at the extreme right-hand zone 411, then all three current detectors 340–342 will detect a relatively high current. It should be understood, however, that in all cases most of the current filament flows directly from $N^+$ zone 414 to the current source 415, rather than to any of the detectors 340–342; and in all cases the current detected by the detectors 340–342 will therefore be smaller by at least an order of magnitude than the total current in the filament. Thereby, the detection process through the zones 490–492 does not itself disturb the filament. Thus, the combination of current detection by the detectors 340–342 provides a binary encoding of the voltage difference between batteries 417 and 416.

Figure 5:
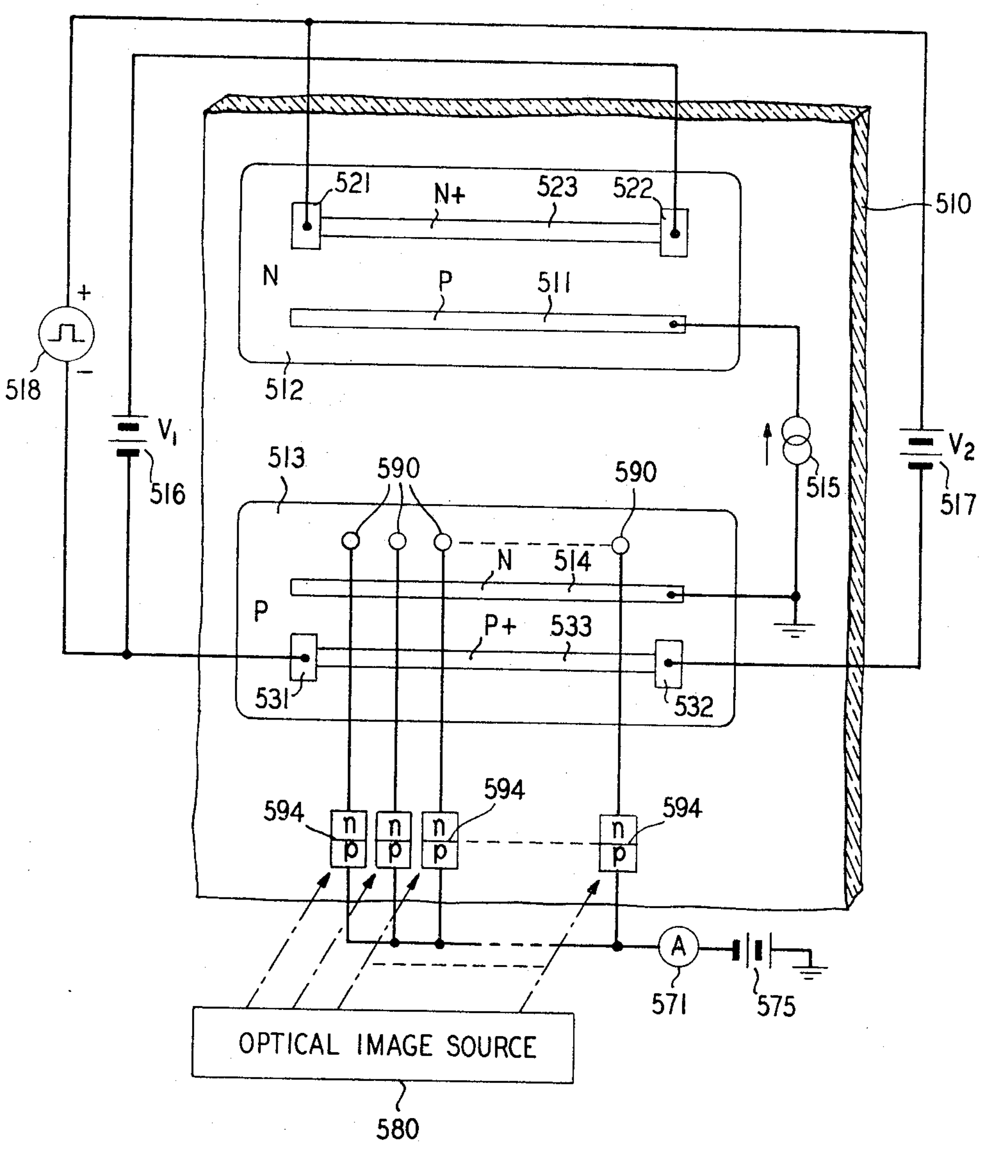
FIG. 5 is a top view diagram of a semiconductor current filament apparatus for use as an optical camera, according to yet another embodiment of this invention.

FIG. 5 is a top view diagram of a semiconductor current filament device, adapted for use as an optical camera. Many of the elements shown in FIG. 5 are similar to those shown in FIG. 1; accordingly, for such elements the reference numerals used in FIG. 5 are equal to those used in FIG. 1 plus 500. As shown in FIG. 5, semiconductor body 510 is provided with an N-type surface zone 512 and a separate P-type surface zone 513. Within the N zone 512 are located an $N^+$ surface zone 523 (with $N^{++}$ terminal zones 521 and 522) and a surface P zone 511. Correspondingly, the P-type zone 513 is provided with a surface $P^+$ zone 533 (together with $P^{++}$ terminal zones 531 and 532) as well as an N surface zone 514. In addition, the P zone 513 contains an array of a plurality of $N^+$ zones 590, typically all having circularly shaped cross sections. Each of these zones 590 is connected to a terminal of each of an array of photoresponsive PN junction diodes 594. The other terminals of the diodes 594 are connected together in common with a serially connected current detector 571 and a battery 575. Advantageously, the battery 575 supplies a reverse bias voltage to each of the diodes 594. Substantially equal batteries 516 and 517, supplying substantially equal voltages $V_1$ and $V_2$, are connected to the terminal zones 531, 532, 521 and 522, as shown in FIG. 5. In addition, a pulse current source 518 supplies current pulses across the terminals 521 and 531. Typically, the source 518 provides pulses of 10 to 100 microamp, for durations of typically 10 microsec. A current source 515 supplies forward electrical current bias across P zone 511 and N zone 514; the current source 515 being sufficient to produce a current filament between these zones 511 and 514 in the high resistivity region of the body 510 therebetween.

In operation, the pulses supplied by the source 518 will sequentially displace the current filament in the x direction in the body 510. In view of the fact that the diodes 594 are subjected to reverse bias (battery 575), no current will flow through the detector 571 even when the current filament is in the neighborhood of a particular $N^+$ zone 590 unless the corresponding PN junction diode 594 contains sufficient mobile charge carriers. These carriers can be created by reason of optical radiation impinging upon said PN junction diode 594, as supplied by an optical image source 580. Thus, as a sequence of pulses is supplied by the source 518, the current filament moves in the *x* direction, while the current detector 571 shows a current only if the corresponding diode 594 is supplied with optical radiation. Hence, the current detected by the detector 571, as a function of time, is a representation of the pattern of optical radiation in the *x* direction supplied by the optical image source 580 radiating upon the various diodes 594.

It should be obvious to the worker skilled in the art that the diodes 594 can be integrated with the $N^+$ zones 590 on the surface of the body 510 in accordance with known integrated circuit techniques.

Figure 6:
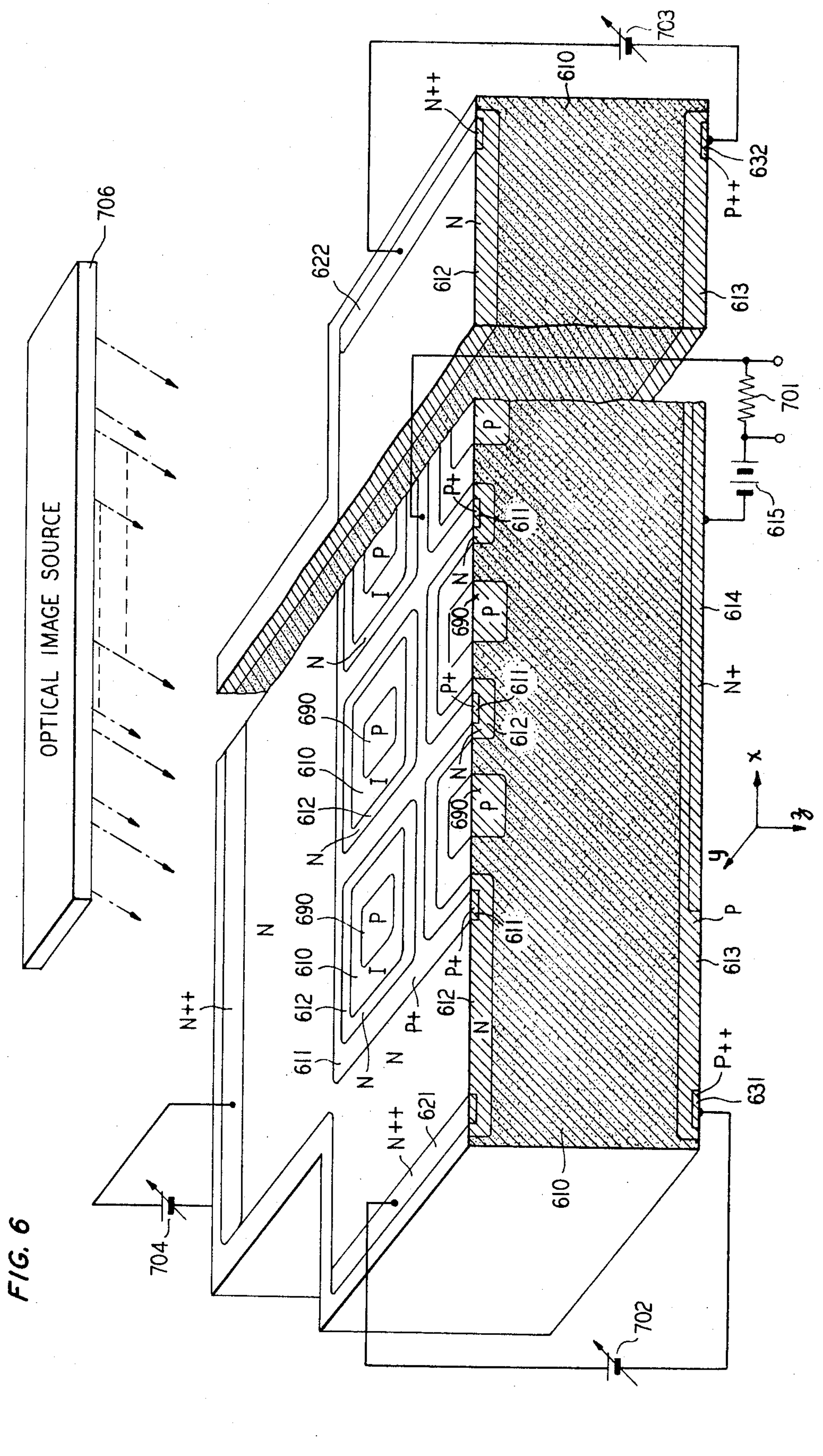
FIG. 6 is a cross-sectional perspective diagram of a semiconductor current filament apparatus, for use as an optical camera, with two-dimensional scan, according to yet another embodiment of this invention.

FIG. 6 shows a semiconductor current filament device with two-dimensional scan capability, for use as an optical camera. Many of the elements shown in FIG. 6 are similar to those shown in FIG. 1; accordingly, for such elements, the reference numerals used in FIG. 6 are equal to those used in FIG. 1 plus 600. A monocrystalline semiconductor body 610 (FIG. 6), having a top and a bottom major surface, is provided with a $P^+$ layer 611 and an intermediate N layer 612 on its top surface, and with an intermediate P layer 613 and an $N^+$layer 614 on its bottom surface. The $P^+$ layer 611 is in the form of a cross-grid located within the N layer 612 also in the form of a (larger sized) cross-grid. In each of the islands formed by these cross-grids is located a P-type smaller island-shaped zone 690. The remainder of the body 610 is high resistivity (I) type semiconductor. A battery 615 is connected through a detection resistor 701 across $P^+$ layer 611 and $N^+$ layer 614 to furnish a forward current sufficient to produce a current filament between intermediate layers 612 and 613. A battery 702 is connected to one side (in the *x* direction) of the intermediate N and P layers 612 and 613 respectively (through a terminal $N^{++}$ zone 621 and a terminal $P^{++}$ zone 631); and a battery 703 is connected to the other side (in the *x* direction) of these intermediate layers 612 and 613 (through terminal $N^{++}$ zone 622 and terminal $P^{++}$ zone 632). Thereby, a reverse bias voltage is supplied across the N layer 612 and the P layer 613. Variation of the voltage supplied by either one of the batteries 702 or 703 controls the position of the current filament in the *x* direction. Likewise, a battery 704 together with another battery (not shown for clarity) connected at the $\pm y$ extremities of the body 610 to terminal $N^{++}$ zones in the N layer 612 and to terminal $P^{++}$ zones in the P layer 613, can control the position in the *y* direction of the current filament. Thus, the location of the current filament in both the *x* direction and *y* direction in the *xy* plane can be independently controlled according to any desired scan pattern.

In operation, the array of island P zones 690 serves as photodetectors in the device shown in FIG. 6, that is, these zones 690 store accumulated majority charge carriers produced by an incident two-dimensional *xy* pattern of optical radiation supplied by an optical image source 706. These accumulated carriers can then serve as a sink of the charge carriers in the current filament. Thus, as the current filament scans the neighborhood of any given P zone 690, the current in a load detector resistor 701 thereby varies in accordance with the accumulated charge carriers in the given P zone 690 (caused by the incident optical radiation pattern). Any scanning pattern of the current filament in the *xy* plane can be achieved by suitably varying with time the voltages supplied by the batteries 702 and 704. Thereby, a two-dimensionally scanned optical camera is provided by the apparatus shown in FIG. 6.

It should be remarked that the shape in the xy plane of the body 610 has been shown in FIG. 6 in the form of a rectangular cross, in order to isolate effectively the scanning of the current filament in the *x* direction (controlled by batteries 702 and 703) from the scanning in the *y* direction. Other shaped configurations may also be possible, as should be evident to the skilled worker in the art.

It should be recognized that the semiconductor devices shown in FIGS. 1 through 6 have an overall PNIPN conductivity profile structure. Therefore, it is advantageous that, in FIG. 1 for example, the N zone 14 extend in the *x* direction as far as the P zone 11, and that the P zone 13 extend as far as the N zone 12 in the *x* direction. Similarly, for the devices shown in FIGS. 2 through 6, it is advantageous that the analogous P and N zones (to FIG. 1) extend equally far in the *x* direction.

Although this invention has been described in terms of particular embodiments, various modifications can be made without departing from the scope of the invention. For example, other semiconductors other than silicon can be used, such as germanium or gallium arsenide. It should be noted that it is possible, with certain choices of design parameters, that the filament deflection of this invention can be achieved with control over the voltage between only a single pair of terminals on only one of the intermediate P or N zones. Likewise, it should be obvious to the ordinarily skilled worker in the art that various elements in different embodiments can be interchanged. In addition, the intermediate I zone, as defined by net significant impurity level concentration, can be narrowed to a zero width, thereby forming a PNPN semiconductor structure, and the depletion region between the reverse biased intermediate N and P zones is then utilized for the same purpose as described above for the I zone, provided the reverse bias voltage is restricted to sufficiently low values to avoid avalanche breakdown. In particular, for example (FIG. 5), the $N^+$ zones 590 can be located in the depletion region of the intermediate P and N zones in a PNPN semiconductor structure.

What is claimed is:

1. Semiconductor apparatus which comprises a semiconductor body having a PNIPN conductivity type zone structure in which one of the intermediate N and the intermediate P type zones has a pair of spaced apart terminals thereon adapted for the application of applied voltages, and in which the other of the intermediate N and the intermediate P-type zones has at least one terminal thereon adapted for the application of applied voltages, said terminals of the pair being spaced apart a sufficient distance such that: when a sufficient forward bias is applied across the outer P and N zones in the presence of a reverse bias applied across the intermediate N zone with respect to the intermediate P zone, a single current filament between the intermediate zones is formed whose axis is located between the pair of spaced apart terminals, the thickness of the I zone being sufficient to prevent avalanche breakdown during operation.

2. Apparatus according to claim 1 which further includes means for controlling the electrical potential between the spaced apart terminals on at least one of the intermediate zones.

3. Apparatus according to claim 1 which further includes means for controlling the electrical potential across the spaced apart terminals on both of the intermediate zones.

4. Apparatus according to claim 1 which further includes means for applying the forward bias across the outer P and N zones.

5. Apparatus according to claim 1 which further includes means for controlling the voltage potential between one of the spaced apart terminals on the intermediate P zone and one of the spaced apart terminals on the intermediate N zone.

6. Apparatus according to claim 1 which further includes an auxiliary $N^+$ zone situated within the intermediate N zone, said auxiliary $N^+$ zone running between the spaced apart terminals of the said intermediate N zone.

7. Apparatus according to claim 1 which further includes an auxiliary $P^+$ zone situated within the intermediate P zone, said auxiliary $P^+$ zone running between the spaced apart terminals of the said intermediate P zone.

8. Semiconductor apparatus which comprises a semiconductor body having a PNPN conductivity type zone structure in which one of the intermediate N and the intermediate P-type zones has a pair of spaced apart terminals thereon adapted for external connection, and in which the other of the intermediate N and the intermediate P-type zones has at least one terminal thereon adapted for the application of applied voltages, said terminals of the pair being spaced apart a sufficient distance such that: when a sufficient forward bias is applied across the outer P and N zones in the presence of a reverse bias applied across the intermediate N zone with respect to the intermediate P zone, a single current filament between the intermediate zones is formed whose axis is located between the pair of spaced apart terminals, the reverse bias being sufficiently low that avalanche breakdown does not occur during operation.

9. Apparatus according to claim 8 which further includes means for controlling the electrical potential between the spaced apart terminals on at least one of the intermediate zones.

10. Apparatus according to claim 8 which further includes means for applying the forward bias.

* * * * *